(12) United States Patent
Chen et al.

(10) Patent No.: US 6,819,536 B2
(45) Date of Patent: Nov. 16, 2004

(54) SUPERCONDUCTING FAULT CURRENT LIMITER

(75) Inventors: Makan Chen, Rupperswil (CH); Willi Paul, Zürich (CH); Michel Decroux, Chambésy (CH); Louis Antognazza, Onex (CH); Oystein Fischer, Coppet (CH)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 10/618,716

(22) Filed: Jul. 15, 2003

(65) Prior Publication Data

US 2004/0027738 A1 Feb. 12, 2004

(30) Foreign Application Priority Data

Jul. 15, 2002 (EP) .......................... 02405605

(51) Int. Cl.⁷ ................................ H02H 7/00
(52) U.S. Cl. ...................................... 361/19
(58) Field of Search .............. 361/19, 141; 327/368, 327/373, 527; 257/34, 661–663; 505/884, 850, 856, 887, 190, 191, 220, 236, 239, 704

(56) References Cited

U.S. PATENT DOCUMENTS

| | | | | |
|---|---|---|---|---|
| 4,055,847 A | * | 10/1977 | Fletcher et al. | 257/34 |
| 4,963,852 A | * | 10/1990 | Drehman | 505/191 |
| 5,053,383 A | * | 10/1991 | Short et al. | 505/325 |
| 5,750,473 A | * | 5/1998 | Shen | 505/210 |
| 6,552,415 B1 | * | 4/2003 | Paul et al. | 257/661 |

FOREIGN PATENT DOCUMENTS

| | | | |
|---|---|---|---|
| DE | 2712990 A1 | 12/1977 | |
| DE | 10014197 A1 | 9/2001 | |
| EP | 1 383 178 A1 | * 1/2004 | .......... H01L/39/16 |
| JP | 05022855 | 1/1993 | |
| WO | 02/47180 A2 | 6/2002 | |

OTHER PUBLICATIONS

2003/0080849 A1 Chen et al.*
M. Lindmayer, Current Limiting Properties of YBCO–Films on Sapphire Substrates, IEEE Transactions on Applied Superconductivity, vol. 9, No. 2, Jun. 1999.*
M. Decroux, Properties of YBCO Films at High Current Densities: Fault Current Limiter Implications, IEEE Transactions on Applied Superconductivity, vol. 11, No. 1, Mar. 2001.*

* cited by examiner

Primary Examiner—Ronald Leja
(74) Attorney, Agent, or Firm—Burns, Doane, Swecker & Mathis, L.L.P.

(57) ABSTRACT

The invention is concerned with a resistive fault current limiter (FCL) based on thin superconducting films. The FCL comprises constrictions (2) with a reduced critical current, separated by connecting paths (3). Upon occurrence of a fault current, the former turn resistive simultaneously and build up a resistance which allows the applied voltage to drop entirely only over the constrictions. Only at a later stage, the connecting paths become resistive and dissipate energy. The thickness and width of an electrical bypass determine said normal resistivities of the constrictions and the connecting paths.

6 Claims, 1 Drawing Sheet

SUPERCONDUCTING FAULT CURRENT LIMITER

FIELD OF THE INVENTION

The invention relates to the field of high-temperature superconductors and in particular to a new design of thin film based superconducting fault current limiters. It is based on a superconducting fault current limiter according to the preamble of claim 1.

BACKGROUND OF THE INVENTION

High temperature superconductors may be applied in superconducting fault current limiters for electrical distribution or transmission networks. Such a current limiter owes its properties to the fact that at a sufficiently low temperature, a superconductor maintains its superconducting properties only as long as a current flowing through its body remains below a critical value. Said critical value is commonly known as critical current density ($J_c$) and basically depends on the temperature of the superconductor and a magnetic field in its interior.

In general, for applications of high temperature superconductors at high electrical powers the problems of the so-called "hot-spots" must not be neglected. Due to unavoidable inhomogeneities in the superconductor material or due to local thermal fluctuations the critical current density suffers small variations across the superconductor. Accordingly, in the case of a short circuit, the initial increase of the fault current will first exceed the critical current at the weakest point of the superconductor. At this point, the voltage drop begins to build up, and joule heating starts to set in, leading to a local increase in temperature and a local crash of superconductivity, i.e. the occurrence of a hot-spot. If the hot-spot does not spread quickly over the superconductor, the fault current will not be limited fast enough and the increase of heat at the hot spot location may finally lead to a destruction of the superconductor.

In electrical distribution or transmission networks including superconducting devices, in case of a fault, the voltage applied to the corresponding section of the network drops either deliberately (if the device is supposed to exhibit current limiting properties) or involuntarily along the superconductor. An ideal high temperature superconductor with a perfectly homogeneous critical current density $j_c$ and a uniform current distribution the latter will, in case of a fault, quench homogeneously over its entire length, i.e. warm over the critical temperature $T_C$ snd turn resistive. Accordingly, the voltage drops over the entire length of the superconductor, leading to small electrical fields and sub-critical energy densities.

A primary remedy is formed by a metallic electrical bypass, which is in close contact over the entire length of the superconductor and thus is electrically in parallel to every potential hot spot. The bypass offers an alternative current path, by means of which a fault current may circumvent the hot spot, thereby homogenising the voltage distribution.

In the German Patent Application DE 100 14 197.8 a superconductor arrangement for preferential use in a fault current limiter and comprising a track, band or wire of high-$T_c$ superconductor material is disclosed. Weak spots with a reduced critical current $I_C$ are provided over the length of the superconductor track. Hence, in the event of a fault current, initial voltage drops start to develop at the weak spots. The dissipation produces heat which is propagating to adjacent regions of the superconductor. If the weak spots are close enough to each other, the superconductor quenches in a homogeneous way.

From the article (in the following referred to as ref.2) by M. Decroux et al., "Properties of YBCO Films at High Current Densities: Fault Current Limiter Implications", IEEE Trans. On Applied Superconductivity, Vol.11, 2046 (2001), thin-film high temperature superconductors are known. A substrate serves a support for a thin epitaxial layer (thickness≈1 $\mu$m) made from a ceramic high temperature material, in particular a composition according to the formula $YBa_2Cu_3O_{7-x}$ with a critical current density of $3\times10^6$ A/cm$^2$ at a working temperature of 77 K. Extensive studies on these materials have shown the existence of a critical electric field $E_c$ which determines the length of a dissipative portion of the superconductor upon application of voltage pulses of various heights.

SUMMARY OF THE INVENTION

It is therefore an object of the invention to create a thin film superconducting fault current limiter of the type mentioned above, which quenches in a controlled way and is not exposed to hot-spots in the case of a fault current occurring in a line comprising the current limiter. This object is achieved by a superconducting fault current limiter according to patent claim 1. Preferred embodiments are evident from the dependent patent claims.

A current limiter according to the invention is composed of several constrictions and interposed connecting sections. The constrictions or weak spots have a lower critical current and thus, in case of a fault current exceeding a nominal current, do revert to a resistive state in the first place, before any heating of the superconductor occurs. The total length and the cross section of the constrictions are such that the constrictions in their resistive state develop a resistance which is sufficient to build up a voltage drop that equals an applied voltage and to limit the current flowing through the constrictions to a value below the prospective "unlimited" fault current. During this initial phase, the connecting sections remain superconducting, they start to turn resistive only at a later stage.

The present invention is based on the finding that a superconducting fault current limiter, after a voltage has been applied to it, develops different regimes as a function of time. In particular, after a transient regime, the superconductor follows an initial current source regime with a current essentially independent of the applied voltage and a current density equal to about 1.5 times the critical current density of the superconducting material.

The resistance of the constrictions during said initial regime is determined by the length of the constrictions and the resistivity averaged over the conductor cross section, which depends on the thicknesses of the superconducting film and an adjacent bypass layer. The resistivity of the constrictions may be chosen such as to limit the power density dissipated by the fault current in the constrictions to an acceptable value. By adjusting the resistance of the connecting sections, the dissipated power density at long terms, i.e. once the connecting sections have turned resistive as well, can be adapted independently.

BRIEF DESCRIPTION OF THE DRAWINGS

The subject matter of the invention will be explained in more detail in the following text with reference to preferred exemplary embodiments which are illustrated in the attached drawings, in which.

The reference symbols used in the drawings, and their meanings, are listed in summary form in the list of reference symbols. In principle, identical parts are provided with the same reference symbols in the figures.

DETAILED DESCRIPTION OF THE INVENTION

Figure 1:
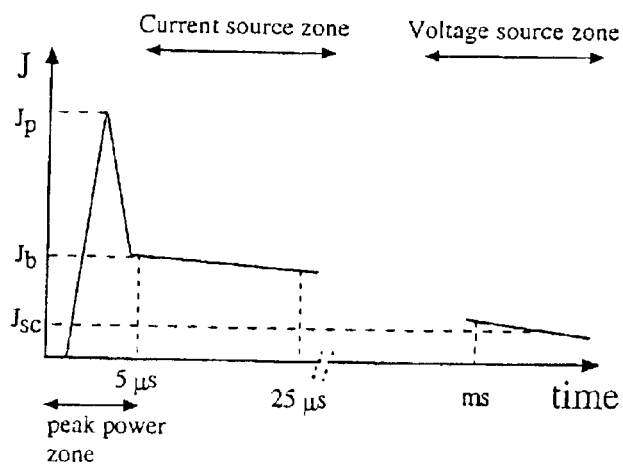
FIG. 1 schematically shows the course of the current density J in the constrictions following a voltage pulse applied to a superconductor track.

During the first $\mu$s of a short circuit, a linear dependence between the initial length of the dissipative region (the switched region) $L_c$ and the applied voltage U has been observed, indicating the existence of a critical electric field $E_c=U/L_c$ (Ref.2). For a given applied voltage, this critical electric field allows to know the length of the dissipative region at the beginning of the short circuit. By inserting constrictions (e.g. local decrease of the line's width) along the meander (FIG. 2), this initial length is split into several smaller regions and then the dissipated power is distributed along the meander. The fault current limiter FCL is designed in such a way that only the constrictions are switching during initial period (i.e. the first $\mu$s) of a short circuit, avoiding the concentration of the dissipated power in one region of the wafer, which is specially important for FCL with several wafers in series since this design allows to control the distribution of the quenched zone over all the wafers.

In the following, the behaviour of the FCL during a short circuit will be described in more detail. The FCL works mainly in three distinct regimes as sketched in FIG. 1. The first one, the peak power zone, is a transient regime; the current increases quickly (below 1 $\mu$s) to a value $J_p$ and then a part of the line is switched, leading to a limitation of the current. We have observed that the current peak $J_p$ is independent of the applied voltage.

The second regime, the current source zone, takes place after the current peak; the FCL behaves as if it is subjected to a current source, i.e. the current $J_b$ is independent of the applied voltage. It has been reported in Ref.2 that, for YBCO at T=77K, $J_p \approx 3 \cdot J_c$ and $J_b = \alpha \cdot J_c$ where $\alpha \approx 1.5$ and $J_c$ is the critical current density ($\approx 3 \cdot 10^6$ A/cm$^2$ at 77K). In this current source zone, the dissipated power is proportional to the normal state resistance of the line at the working temperature (i.e. around 77K). The power dissipated by the line can be decreased by decreasing the resistivity of the constricted regions.

At longer time the FCL works in the voltage source regime. The short circuit current $J_{sc}$ and the dissipated power are inversely proportional to the normal state resistivity of the line at an increased temperature of typically above 100K. The dissipated power can be decreased only if the resistance of the dissipative region is increased, in contradiction with the behavior in the current source regime.

The main goal of this new design of the FCL is to allow (a) the decrease of the surface peak power density at the beginning of the short circuit and (b) a low and uniformly dissipated power across the whole length of FCL component at longer time. This is obtained by decreasing the normal resistivity of the constrictions, which become instantaneously dissipative, and by increasing the resistivity of the connecting path, which become normal conducting at longer times. This is readily achieved by varying the thickness of the bypass layer of both the constricted and the connecting path. This decrease of the dissipated power by the wafer allows to increase the nominal power and/or the duration of the limiting function.

From the foregoing, a basic design for a FCL including critical design parameters can be deduced.

Figure 2:
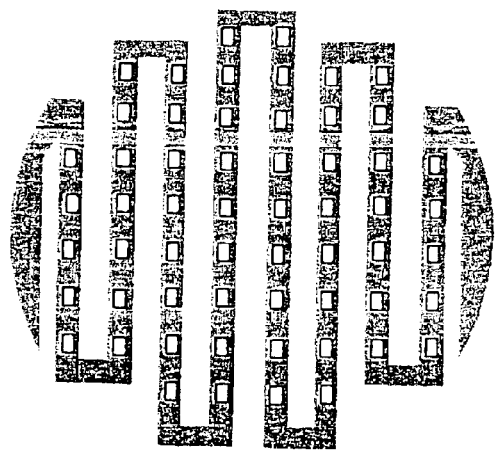
FIG. 2 shows a meander-shaped superconductor track with constrictions.
Figure 3:
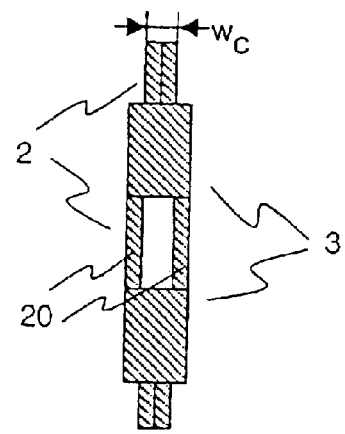
FIG. 3 shows a constriction and a connecting section.

FIG. 2 and FIG. 3 show this new design of the superconducting fault current limiter. The FCL is constituted by an YBCO/bypass meander with a total length $L_{tot}$ and arranged on a substrate which preferably is a good thermal and a bad electrical conductor at around 100K. The YBCO layer has a constant thickness e and a critical current density $J_c$ at the working or liquid nitrogen temperature (T=77K). A possible variation in superconductor thickness e is not considered, as it would unnecessarily complicate the following calculations.

The constrictions have a width $w_c$ and the connecting sections a width $w_p$ (FIG. 2). These constrictions can be split in n paths, of width $w_c/n$, in order to increase the heated volume during the short circuit and then to slow down the increase of the temperature of the line. FIG. 2 shows an example with n=2. $w_p$ is chosen with respect to $w_c$ in such a way that only the constrictions are switching at the beginning of the short circuit.

Prior to the calculation of all the design parameters of the FCL, the following parameters have to be fixed:

The nominal peak power $$P_{peak}^n,$$

the nominal peak voltage $$U_{peak}^n$$

and the nominal peak current $$I_{peak}^n = P_{peak}^n / U_{peak}^n \equiv I_c$$

where $I_c$ is the critical current of the constrictions.

The ratio between the width of the constriction and the width of the connecting path: $\mu = w_p/w_c$. $\mu$ has to be higher than the ratio of the maximal and the minimal critical current density over the wafer.

The supported surface power density $p_b$ after the current peak ($p_b \div J_b^2$ (FIG. 1)). As reported in Ref.2, $p_b$ should be below a value of around 22 kW/cm$^2$ in order to avoid the destruction of the constrictions.

The filling factor $\beta$, which is the ratio of the meander surface and the surface of the wafer. $\beta$ is smaller than yet as close as possible to unity.

The ratio $\delta$ between the limited current density at long term ($J_{sc}$, FIG. 1) and the nominal current density $J_c$. $\delta$ depends on the thermal environment of the FCL line. Better performances are expected with lower value of $\delta$.

Taking into account these values, all the parameters of the FCL can be determined, i.e:

The width of the constrictions $w_p$ and of the connecting path $w_c$.

The total length $L_c$ of the constrictions and its reduced normal state resistivity $\rho_c$. (i.e. the average resistivity times the ratio of the superconductor thickness e to the total track thickness of superconductor and bypass)

The total length $L_{tot}$ of the meander.

The total length $L_p$ of the connecting path and its reduced normal state resistivity $\rho_p$. (at 77K, i.e before the heating sets in and further increases the resistance).

The following relations are used for the calculation of all the parameters of the FCL:

| | | |
|---|---|---|
| ① | $w_c = \dfrac{P_{peak}^n}{U_{peak}^n \cdot J_c \cdot e}$ | The width of the constriction "nominal condition" |
| ② | $\rho_c = \dfrac{p_b}{J_c^2 \cdot \alpha^2 \cdot e}$ | The reduced resistivity of the constrictions at 77K "initial fault current condition" |
| ③ | $E_c = \alpha \cdot \rho_c \cdot J_c$ | The critical electric field |
| ④ | $L_c = \dfrac{U_{peak}^n}{E_c}$ | The total length of the constrictions "initial fault current condition" |
| ⑤ | $w_p = \mu \cdot w_c$ | The width of the connecting path |
| ⑥ | $L_{tot} = \dfrac{\beta \cdot S_s}{w_p}$ | The total length of the meander |
| ⑦ | $L_p = L_{tot} - L_c$ | The total length of the connecting path |
| ⑧ | $\rho_p = \dfrac{\mu \cdot U_{peak}^n}{J_c \cdot L_p} \cdot \left(\dfrac{1}{\delta} - \dfrac{1}{\alpha}\right)$ | The resistivity of the connecting path |

A FCL with Au as a bypass layer is taken as an example. The typical parameter of the YBCO/Au FCL line made on a 2" wafer are the critical current density ($J_c=3\cdot10^6$ A/cm² at 77K) and the YBCO layer thickness (e=3000 Å). The surface of the wafer is $S_S=20.3$ cm².

For a FCL made on a 2"Al$_2$O$_3$ wafer, the following parameters have been chosen:

The nominal peak power $$P_{peak}^n = 5 \text{ kW}.$$

The nominal peak voltage $$U_{peak}^n = 300 \text{ V}.$$

The ratio between the width of the constrictions and of the connecting path $\mu=2$.
The surface power density $p_b=3$ kW/cm².
The filling factor $\beta=0.7$.
The ratio between the current at long term and the nominal current, $\delta=0.2$.

In the example the calculated parameters are:

$w_c$=1.85 mm, $\rho_c$=5 $\mu\Omega$cm, $L_c$=13.5 cm
$w_p$=3.7 mm, $\rho_p$=35 $\mu\Omega$cm, $L_p$=24.8 cm The thickness of the gold layer on the constriction and on the connecting path has to be determined by taking into account its bulk resistivity, the quality of the film and the resistivity of the YBCO film.

The present invention describes a new design for resistive FCL based on thin films with constrictions homogeneously distributed along the line. Its main advantages are:

1) The initial surface peak power density dissipated by the FCL is controlled by adapting the thickness of the bypass layer on these constrictions.
2) The dissipated surface power density by the FCL at long term (few ms after the beginning of the short circuit) is controlled by adapting the thickness of the bypass layer on the connecting paths.
3) The constrictions allow to homogeneously distribute the quenched zones over the whole wafer, avoiding the localization of the dissipated power in one region of the wafer. The possibility to control the distribution of the dissipative zones along the whole meander is crucial for FCL made of several wafers in series.
4) The splitting of the constriction in several parts allows to achieve a better thermal stabilization thanks to a large effective heated volume of the substrate.

If the current limiter is to be operated in AC mode, apart from the fact that one has to distinguish between the peak and the RMS values of e.g. the nominal current $I_N$, similar conclusions regarding its design do apply. Depending on the actual time the fault current "pulse" occurs within an AC period, the evolution of the current through the superconductor might deviate from what is depicted in FIG. 1. However, it is still a primordial requirement that the total ohmic resistance $R_C$ of the constrictions at working temperature $T_N$ is sufficient to cause a voltage drop equal to the nominal voltage $U_N$ at an initial fault current $I_b$. The latter is in this case defined as the current flowing after a transient regime of a few $\mu$s duration, and may itself be a time varying current limited to values below a prospective fault current.

| LIST OF DESIGNATIONS | |
|---|---|
| 1 | conductor track |
| 2 | constrictions |
| 20 | path |
| 3 | connecting sections |

What is claimed is:

1. A superconducting resistive current limiter adapted for a nominal voltage $U_N$ and carrying a nominal current $I_N$ at a working temperature $T_N$, with at least one track of length $L_{tot}$ comprising a thin-film of high-temperature superconducting material with a critical current density $J_c$ and an electrical bypass layer in contact with the film, wherein the track consists of a multitude of constrictions having a total length $L_c$ and each having an approximately constant critical current $I_{c,c}$ equal to the nominal current $I_N$ and being separated from each other by connecting sections having a critical current $I_{c,s}$ larger than $I_N$, wherein the total resistance $R_c$ of the constrictions at working temperature $T_N$ is adapted to cause a voltage drop equal to the nominal voltage $U_N$ at an initial fault current $I_b$ limited to a value below a prospective fault current.

2. The current limiter according to claim 1, wherein the resistance $R_c$ of the constrictions at an initial fault current $I_b$ with a current density $J_b$ of approximately 1.5 times $J_c$ flowing in the constrictions is adapted to cause a voltage drop $U_c=R_c$ times $I_b$ equal to the nominal voltage $U_N$.

3. The current limiter according to claim 2, wherein an averaged reduced resistivity $p_c$ of the constrictions at working temperature $T_N$ and at the initial fault current density $J_b$ is adapted to limit the surface power density $p_b$ dissipated by the constrictions.

4. The current limiter according to claim 3, wherein the averaged reduced resistivity $\rho_c$ of the constrictions is given by $\rho_c = p_b/J_b^2 e$, wherein e is the thickness of the superconducting film at the constrictions.

5. The current limiter according to claim 4, wherein the conductivity of the bypass layer is higher along the constrictions than along the connecting sections.

6. The current limiter according to claim 1, wherein the constrictions are divided into two or more paths electrically connected in parallel.

* * * * *